SEMICONDUCTOR PIN JUNCTION MICROWAVE LIMITER

Filed May 26, 1961

INVENTOR
R. M. RYDER
BY H W Lockhart
ATTORNEY

United States Patent Office 3,217,212

Patented Nov. 9, 1965

3,217,212

SEMICONDUCTOR PIN JUNCTION MICROWAVE LIMITER

Robert M. Ryder, Summit, N.J., assignor to Bell Telephone Laboratories, Incorporated, New York, N.Y., a corporation of New York Filed May 26, 1961, Ser. No. 112,831
9 Claims. (Cl. 317—234)

This invention relates to semiconductor translating devices.

More particularly, this invention relates to PN junction semiconductor devices for operation at microwave frequencies.

In microwave transmission systems as in most transmitting systems for ultimately energizing some utilization circuit, it becomes necessary to provide some means for protecting the utilization circuit from excessively large amplitude or overload signals. In systems including reactance coupled, paired transmission lines as described in U.S. Patent 3,008,089 granted November 7, 1961, to A. Uhlir, Jr., the PN or PIN junction diode inserted between the lines can be utilized to this end. Specifically, the diode is designed to function essentially as an open circuit for the small amplitude signals normally encountered and as a conductive short, or, alternatively, as a susceptive short circuit for excessively large amplitude signals which might damage the utilization circuit. In particular, the typical PIN diode exhibits a small susceptance to a small amplitude signal and an increasingly larger susceptance and conductance to larger amplitude signals.

It is desirable that the decrease in the impedance exhibited by the diode in response to the excessively large amplitude signal be more rapid than has hitherto been obtained and that it resume its normal function as an open or low susceptance circuit as quickly as possible after the signal is of normal level.

In a typical microwave transmission system, a PIN diode is mounted across a transmission line such that charge carriers are appropriately injected into the I region (the intermediate intrinsic or high resistivity region) for effecting an impedance modulation as is described in detail below. However, the charge carriers require some finite time both for injection and withdrawal conveniently termed "charging time" and "storage time," respectively. Accordingly, the modulation of the impedance and the corresponding recovery speed of the diode are determined by the charging and storage time of the injected charge carriers, respectively.

Therefore, an object of this invention is a semiconductor diode structure which exhibits a reduced carrier turn-on or charging time.

Another object of this invention is a diode structure which exhibits a higher degree of carrier charging and thus a more effective protector action than the typical diode structure.

In one specific embodiment of this invention, each of the two terminal regions of the diode is made to include a plurality of P and N conductivity type regions which, collectively, inject and ideally do not withdraw charge carriers under bias conditions of either polarity. Thereby the charge carrier charging time is minimized and the problem of depletion of the stored charge by the reverse half-cycle of voltage as discussed in detail below is avoided. Terminal regions including the fine-grained structure of P and N-type regions in accordance with this invention are conveniently characterized as "double injecting" because they inject either type of charge carrier as required.

Therefore, a feature of this invention is a semiconductor diode including at least one double injecting terminal region.

The invention and its objects and features will be understood more fully from the detailed discussion rendered in conjunction with the drawing, wherein.

It is to be understood that the figures are for illustrative purposes only and not necessarily to scale.

Figure 1:
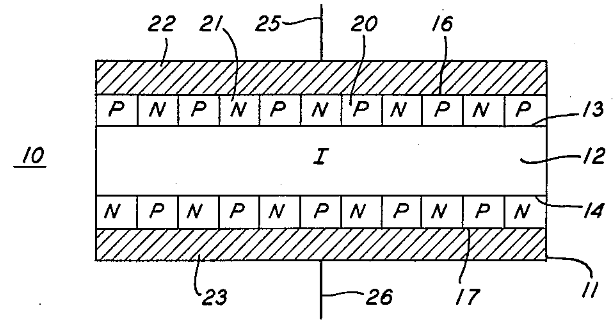
FIG. 1 is a schematic section of a diode including double injecting terminal regions in accordance with this invention.

With reference specifically to FIG. 1, the silicon semiconductor diode 10 comprises a monocrystalline wafer 11 about .050 x .050 x .003 inch. The wafer includes a substantially intrinsic (I) or high resistivity region 12 which is about .002 inch thick and is bounded along its major opposing boundaries 13 and 14 by two terminal regions 16 and 17. Each of the terminal regions includes a mosaic of interlaced lower resistivity regions 20 and 21 of P and N conductivity type, respectively. Typically, such regions include doping levels at least a hundred times that of the I region. The terminal regions 16 and 17 in turn are bounded by overlayers 22 and 23, respectively, of a metal such as nickel for providing electrodes. These large area electrodes are common to the underlying regions 20 and 21 and facilitate circuit connection to the transmission line.

When the element is inserted by way of the electrodes 22 and 23 across a microwave transmission line and the normal small amplitude signal is impressed on the line, the charge injection into the intermediate I layer 12 is negligible. Accordingly, the resistivity of this I layer remains high and the diode acts like a high-quality capacitor whose susceptance can be tuned out for minimizing the transmission loss therethrough.

However, when large amplitude signals are impressed on the line, the I region becomes appreciably charged, as both holes and electrons are injected therein in large numbers from the terminal regions whatever the polarity of the corresponding electrode. More specifically, the N-type conductivity regions 21 inject electrons when negatively biased while the P-type regions 20 inject holes when positively biased; and similarly for the other electrode. The I region initially charges and ultimately remains in some steady charge condition which is relatively high for high amplitude signals. Since the impedance is related reciprocally to the number of charge carriers or the charge in the I region, the impedance is much lower for large amplitude signals than for small amplitude signals.

The above explanation also is directed to the charging time phenomenon which is reduced (in comparison with a PIN diode) by decreasing the relative importance of the withdrawal of charge carriers when the polarity of the impressed signal reverses. Implicit in the explanation, in other words, is the fact that relatively few charge carriers are withdrawn from the I region before a high charge concentration can be built up. Specifically, by maintaining small the cross-sectional area of the individual P and N-type conductivity regions included within the terminal semiconductor region, withdrawal of charge carriers is minimized during reversals of polarity of the applied signal. For example, if the P and N-type conductivity regions are square, the side of the square advantageously is less than the thickness of the I region (.002 inch) insuring, during the charging time transient, the withdrawal of substantially less than fifty percent of the charges injected on the preceding half-cycle. This behavior is in contrast with the PIN diode, where much more than fifty percent may be withdrawn at each reversal.

Although the figure illustrates the double injecting terminal region as made up of successive regions of opposite conductivity type, this is not the only structure for realizing the principles of the invention. For an I region with a thickness of .002 inch, the various regions advantageously may be small dots or stripes having a diameter or width of about .002 inch and separated by about .002 inch of the high resistivity material. Of course, it is possible to achieve some advantage over the prior art diode even with larger structure for the mosaic characteristic of the terminal regions. Moreover, it is feasible to utilize low resistivity regions of random sizes and random distribution interspersed with high resistivity material, or to utilize double injecting terminal regions of various configuration, as described further below, in a single device.

The above explanation is directed primarily at impedance modulation. However as is noted in the introduction, there are variable reactance aspects to be emphasized. Specifically, the term "PN junction" characterizes the separation of opposite charges by a space charge region. The accumulation of charge carriers can be thought of as analogous to the charge on the plates of a capacitor, and the space charge region as the dielectric material between the plates. Accordingly, when a small amplitude signal is impressed across the active region of a device in accordance with this invention, the number of charge carriers accumulated is small and varies with the polarity of the impressed signal until some substantially constant number is reached. In this case the capacitance is modest. For large amplitude signals the capacitance is quite significant and the resulting relatively high susceptance reflects the signal back down the transmission line.

Figure 2:
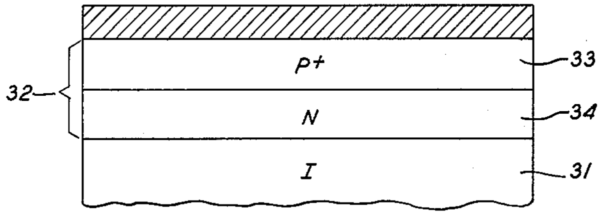
FIGS. 2 and 3 are schematic sections of two other forms of double injecting terminal regions in accordance with this invention.

FIG. 2 illustrates a second structure in accordance with this invention. However, for clarity, only a portion of the structure is shown, the remainder typically being symmetrical about the I region in the manner of the device of FIG. 1 but may be antisymmetrical (of the $P^+NIPN^+$ configuration). In either case, the lower resistivity layer advantageously is the outside layer. As in FIG. 1, the device is composed of a semiconductor material, illustratively silicon, and includes a substantially intrinsic region 31. In this embodiment the double injecting terminal region is formed by providing contiguous to the I region a highly doped P-type conductivity layer 33 over a more lightly doped N-type conductivity layer 34. In this connection the term "doped" refers to the significant impurities included in the various layers. Accordingly, "highly doped P-type" refers to a high concentration of P-type impurities as for example $10^{19}$ atoms or greater of boron/cubic centimeter while the term "lightly doped N-type" refers to a lower concentration of N-type impurities as for example $10^{17}$ atoms or less of phosphorus/cubic centimeter. Advantageously, both layers 33 and 34 have thicknesses of about .0001 inch. Moreover, there is some advantage in maintaining high the charge carrier lifetime of layer 34 since its thickness should be less than the diffusion length of carriers injected therein from the surface layer 33.

When positively biased, holes are injected from the P-type layer 33 through the N-type layer 34 into the underlying I layer 31. When negatively biased, electrons are injected directly from the N-type layer 34 into the I layer 31.

Figure 3:
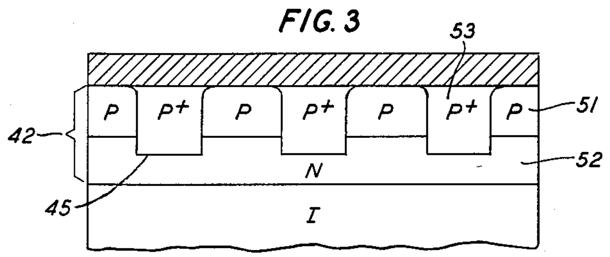

FIG. 3 illustrates a modification of the P-type layer 33 of FIG. 2. The double injecting terminal region 42 includes a P-type conductivity region 51 which corresponds to the P-type conductivity layer 33 of FIG. 2 and a contiguous N-type conductivity region 52. However, the region 51 includes a fine-grained grid of more highly doped regions 53 which inject holes when positively biased, the injected charge carriers passing through the extended regions 45 of the highly doped regions 53 so that they ultimately may enter the I region and greatly increase its admittance.

Figure 4:
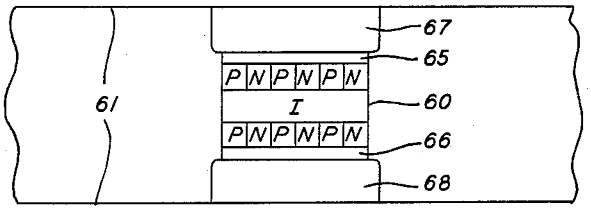
FIG. 4 is a schematic representation of a diode limiter in accordance with this invention incorporated in a waveguide.

FIG. 4 illustrates schematically the incorporation of a limiter 60 in accordance with this invention into a microwave transmission line 61. Conveniently, one or more of these devices is connected in parallel across the line by way of electrodes 65 and 66. Advantageously, the diode is mounted between conductive posts 67 and 68 extending from opposite sides of the line.

A device including a double injecting terminal region or electrode in accordance with this invention may be fabricated in the following manner: A substantially intrinsic silicon slice about .003 inch thick is exposed at about 1100 degrees centigrade to phosphorus pentoxide vapor for forming an N-type surface layer .0003 inch deep. A diffusion resistant oxide coating as disclosed in Patent No. 2,802,760, issued August 13, 1957 to L. Derick and C. J. Frosch is formed subsequently by heating the wafer in an atmosphere of steam at about 1000 degrees centigrade. This oxide coating is masked selectively by well known photo-resist techniques and etched to expose selectively the N-type surface layer. Then the wafer is exposed at about 1100 degrees centigrade to a vapor of boron oxide to convert to P-type conductivity the exposed portions of the N-type surface layer as illustrated in FIG. 1. After this step both P and N diffusion are about .0005 inch deep. The residual oxide coating is removed by washing in hydrofluoric acid and, finally, metallic contact is made to both the P and N-type conductivity regions by an electroless nickel deposition followed by sintering and plating as is well known by those skilled in the art. The slice is then cut up into wafers about .050 inch square which may be used singly or in pairs as protective limiters.

At zero bias, such a wafer exhibits a low-loss capacitance of about three picofarads to small signals. However, when a large microwave signal is applied, the conductivity of the I region quickly increases greatly so that the impedance of the wafer approximates one ohm for microwave frequency currents of several amperes.

The above-described specific illustrative embodiments are susceptible of numerous and varied modifications, all clearly within the spirit and scope of the principles of the present invention as will at once be apparent to those skilled in the art. No attempt has here been made to exhaustively illustrate all such possibilities.

For example, although the invention is illustrated in terms of silicon semiconductor material, it should be apparent that the invention is not restricted thereto, other semiconductor materials such as germanium and the Group III–V intermetallic compound semiconductor materials serving quite well.

Moreover, it should be apparent also that the resistivity of the I region may be modified considerably within the scope of this invention. Specifically, the I region need only be a low-loss region substantially devoid of charge carriers at zero bias or, in other words, a high resistance region in comparison with the P and N-type conductivity regions.

What is claimed is:

1. A semiconductor structure including a first and a second layer of semiconductor material separated by a high resistance layer of semiconductor material, a separate low resistance contact to each of said first and second layers, said structure being characterized in that each of said first and second layers includes a plurality of P-type and N-type conductivity regions, said low resistance contacts being common to each of said P-type and N-type conductivity regions.

2. A semiconductor structure including a first and a second layer of semiconductor material separated by a substantially intrinsic layer of semiconductor material, a separate large area low resistance contact to each of said first and second layers, said structure being characterized in that each of said first and second layers includes a mosaic of interlaced P-type and N-type conductivity regions, said low resistance contact being effectively in common with each of said P-type and N-type conductivity regions.

3. A semiconductor structure including a first and a second layer of semiconductor material separated by a substantially intrinsic layer of semiconductor material, a separate large area low resistance contact to each of said first and second layers, said structure being characterized in that each of said first and second layers includes at least one P-type and one N-type conductivity region, said low resistance contact being effectively in common with each of said P-type and N-type conductivity regions.

4. A semiconductor structure including a first and a second layer of semiconductor material separated by a substantially intrinsic layer of semiconductor material, each of said first and second layers comprising a third layer of semiconductor material of a first conductivity type contiguous with said intrinsic layer and a fourth layer of semiconductor material of a second conductivity type contiguous with said third layer, said fourth layer having a resistivity substantially less than that of said third layer, said fourth layer being coated with a layer of electrode metal, and being interspersed with portions of even lower resistivity material, said portions extending from said layer of electrode metal through said fourth region for effecting an electrical connection with said third region.

5. A lamellate semiconductor structure comprising a first and a second double injecting semiconductor terminal region separated by a high resistance semiconductor region and a separate low resistance contact to each of said terminal regions.

6. A lamellate semiconductor structure for incorporation in a wave guide, said structure comprising a first and a second layer of semiconductor material separated by a substantially intrinsic layer of semiconductor material, each of said first and second layers including a mosaic of interlaced P and N conductivity type regions for providing a double injecting terminal region.

7. A lamellate semiconductor structure for incorporation in a microwave transmission line, said structure comprising a first and a second layer of semiconductor material separated by a substantially intrinsic layer of semiconductor material, said intrinsic layer having a thickness of about .002 inch, each of said first and second layers including a plurality of P and N conductivity type regions, the width of each of said regions being less than the thickness of said intrinsic region, and a substantially ohmic contact to each of said first and second layers.

8. A lamellate semiconductor structure, said structure comprising a first and a second layer of semiconductor material separated by a substantially intrinsic layer of semiconductor material, said intrinsic layer having a thickness of about .002 inch, each of said layers including a mosaic of interlaced P and N conductivity type regions, the width of and the spacing between the P and N conductivity type regions being less than the thickness of said intrinsic region for forming a double injecting terminal region.

9. A structure in accordance with claim 5 wherein said semiconductor material is silicon.

References Cited by the Examiner

UNITED STATES PATENTS

| | | | |
|---|---|---|---|
| 2,840,497 | 6/58 | Longini | 317—235 |
| 2,883,313 | 4/59 | Pankove | 307—88.5 |

DAVID J. GALVIN, *Primary Examiner.*

GEORGE N. WESTBY, *Examiner.*